United States Patent
Bao et al.

(10) Patent No.: US 8,916,461 B2
(45) Date of Patent: Dec. 23, 2014

(54) ELECTRONIC FUSE VIAS IN INTERCONNECT STRUCTURES

(71) Applicant: International Business Machines Corporation, Armonk, NY (US)

(72) Inventors: Junjing Bao, Fishkill, NY (US);
Griselda Bonilla, Fishkill, NY (US);
Samuel S. Choi, Beacon, NY (US);
Daniel C. Edelstein, White Plains, NY (US); Ronald G. Filippi, Hopewell Junction, NY (US); Naftali Eliahu Lustig, Croton-on-Hudson, NY (US);
Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 13/623,132

(22) Filed: Sep. 20, 2012

(65) Prior Publication Data
US 2014/0077334 A1 Mar. 20, 2014

(51) Int. Cl.
*H01L 21/44* (2006.01)

(52) U.S. Cl.
USPC ........................................................ 438/601

(58) Field of Classification Search
CPC .............. H01L 21/768; H01L 23/5256; H01L 23/53266; H01L 23/53238; H01L 23/53223
USPC ............ 257/529, E21.577, E23.149; 438/601
See application file for complete search history.

(56) References Cited

U.S. PATENT DOCUMENTS

| | | | |
|---|---|---|---|
| 7,241,676 B2* | 7/2007 | Watanabe et al. | 438/597 |
| 7,785,934 B2 | 8/2010 | Hsu et al. | |
| 7,893,520 B2* | 2/2011 | Yang et al. | 257/529 |
| 8,013,421 B2 | 9/2011 | Ono | |
| 8,035,191 B2 | 10/2011 | Lin et al. | |
| 8,133,767 B2 | 3/2012 | Yang et al. | |
| 8,159,041 B2 | 4/2012 | Saitou | |
| 2007/0161290 A1* | 7/2007 | Fitzsimmons et al. | 439/607 |
| 2008/0130200 A1* | 6/2008 | Edelstein et al. | 361/330 |
| 2009/0278228 A1* | 11/2009 | Hsu et al. | 257/529 |
| 2009/0278229 A1* | 11/2009 | Yang et al. | 257/529 |
| 2011/0156858 A1 | 6/2011 | Poppe et al. | |
| 2012/0326269 A1* | 12/2012 | Bonilla et al. | 257/529 |

\* cited by examiner

*Primary Examiner* — Vongsavanh Sengdara
(74) *Attorney, Agent, or Firm* — L. Jeffrey Kelly; Catherine Ivers

(57) ABSTRACT

An electronic fuse and method for forming the same. Embodiments of the invention include e-fuses having a first metallization level including a metal structure, a second metallization level above the first metallization level, a metal via in the second metallization level, an interface region where the metal via meets the first metallization level, and a damaged region at the interface region. Embodiments further include a method including providing a first metallization level including a metal structure, forming a capping layer on the first metallization level, forming an opening in the capping layer that exposes a portion of the metal structure; forming above the capping layer an adhesion layer contacting the metal structure, forming an insulating layer above the adhesion layer, etching the insulating layer and the adhesion layer to form a recess exposing the metal structure, and filling the fuse via recess to form a fuse via.

9 Claims, 7 Drawing Sheets

ELECTRONIC FUSE VIAS IN INTERCONNECT STRUCTURES

BACKGROUND

The present invention relates generally to microelectronic devices, and specifically to electronic fuse vias formed as part of interconnect structures.

A fuse is a structure that is blown in accordance with a suitable electrical current. For example, an electrical current is provided through the fuse to eventually cause the fuse to blow and create an open circuit. Programming refers to intentionally blowing a fuse and creating the open circuit. In integrated circuitry memory devices, fuses can be used for activating redundancy in memory chips and for programming functions and codes in logic chips. Specifically, dynamic random access memory (DRAM) and static random access memory (SRAM) may employ fuses for such purposes.

Electronic fuses (e-fuses) can also be used to prevent decreased chip yield caused by random defects generated in the manufacturing process. Moreover, e-fuses provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield. Previously, e-fuses were incorporated at the silicon level of microelectronic devices, but as devices continue to scale down, silicon-level e-fuses become increasing impractical due to the maximum allowable current through the silicon level.

To address this problem, e-fuses may be incorporated into back-end-of-the-line (BEOL) structures such as metal vias to take advantage of electromigration (EM) effects to blow and create the open circuit. For example, EM can be defined as the transport of material caused by the gradual movement of ions in a conductor due to the momentum transfer between conducting electrons and diffusing metal atoms. In e-fuses that take advantage of EM effects, such transport of material caused by the gradual movement of ions can produce voids which cause the e-fuse to blow and create the open circuit.

However, EM effects can be difficult to control, resulting in the formation of voids outside of the desired fuse region, for example in metal lines connected to an e-fuse via. Accordingly, a fuse via that will reliably blow within the via without causing damage to the surrounding BEOL structures is desirable. Referring to FIG. 1, a structure 10 may represent a typical e-fuse via structure in which the EM failure mode of the e-fuse via structure after programming is depicted. The structure 10 may include a first metallization level 20, including a metal line 25, and a second metallization level 30 above the first metallization level 20. The second metallization level 30 may include a metal line 33 and an e-fuse via 36, which joins the metal line 25 and the metal line 33. In other embodiments, metal lines 25 and 33 may be any other known back-end metal structure, such as vias. The first metallization level 20 may further include a first insulator layer 21 and a capping layer (not shown) below first insulator layer 21, and the second metallization level 30 may further include a second insulator layer 31 and a capping layer 32 separating the features of the first metallization level 20 from the second insulator layer 31 except where intended (e.g., where the metal line 25 joins the e-fuse via 36). It should be noted that while this application refers to a first metallization level and a second metallization level, microelectronic devices may have many metallization levels. Therefore, as used in this application, first metallization may refer to any metallization level x, while second metallization level may refer to any metallization level x+1 above metallization level x.

During programming, voids 41-43 may form in the e-fuse via 36, metal line 25, and metal line 33, respectively. However, programming will ideally cause only the e-fuse via 36 to blow (i.e. cause voids capable of substantially increasing electrical resistance to form) while maintaining the integrity of all surrounding circuits. For example, void formation in metal lines 25 and 33 may result in undesirable damage to adjacent capping layers (e.g. the capping layer 32, and a not-shown capping layer above the second insulator layer 31). Voids in metal lines 25 and 33 may also cause damage to circuits other than the one targeted during programming. Further, the location of the void formation may affect the amount of current required to blow the e-fuse. Generally, higher currents may be required to form a larger void, therefore higher currents may be necessary when the void forms in the connected lines rather than in the fuse via. Further, it is possible in some cases for the void 41 to not fully span the e-fuse via 36 as depicted. In such cases, it is possible for the resistance across the via to increase, but not to the degree required by the programming. Therefore, the performance and reliability of e-fuses may be improved by encouraging voids to predictably form only in the e-fuse via (e.g., the void 41 in the e-fuse via 36) and not in the connecting metal structures (e.g. metal lines 25 and 33), while also ensuring complete failure of the e-fuse via.

BRIEF SUMMARY

The present invention relates to electronic fuse structures and methods of forming said electronic fuse structures. According to at least one exemplary embodiment, a electronic fuse structure may include a first metallization level including a first metal structure, a second metallization level containing a metal via above the first metallization level, an e-fuse interface region where the metal via meets the first metallization level, and a damaged region at the e-fuse interface region.

Embodiments may further include methods of forming fuse structures. The method may include providing a first metallization level including a metal structure having a top surface substantially flush with a top surface of the first metallization level, forming a capping layer on the top surface of the first metallization level, and forming an opening in the capping layer that exposes a portion of the top surface of the metal structure. The method may further include forming an adhesion layer above the capping layer that lines the opening in the capping layer and contacts the first metal structure, forming an insulating layer above the adhesion layer. The method may further include etching the insulating layer and the adhesion layer to form a fuse via recess that exposes a top surface of the metal structure, and filling the fuse via recess to form a fuse via.

Embodiments of the present invention may further include semiconductor structures including a fuse via and a non-fuse via, and methods of forming the fuse via and non-fuse via simultaneously. The structure may include a first metallization level including a first metal structure and a second metal structure, a second metallization above the first metallization level including a first metal via, a second metal via, and a capping layer that has an opening above the first metal structure. The structure may further include an adhesion layer above the capping layer lining at least a portion of the opening of the capping layer, and an insulating layer. The structure may further include a e-fuse interface region where the first metal via meets the first metal structure, and a damaged region at the e-fuse interface region.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Figure 1:
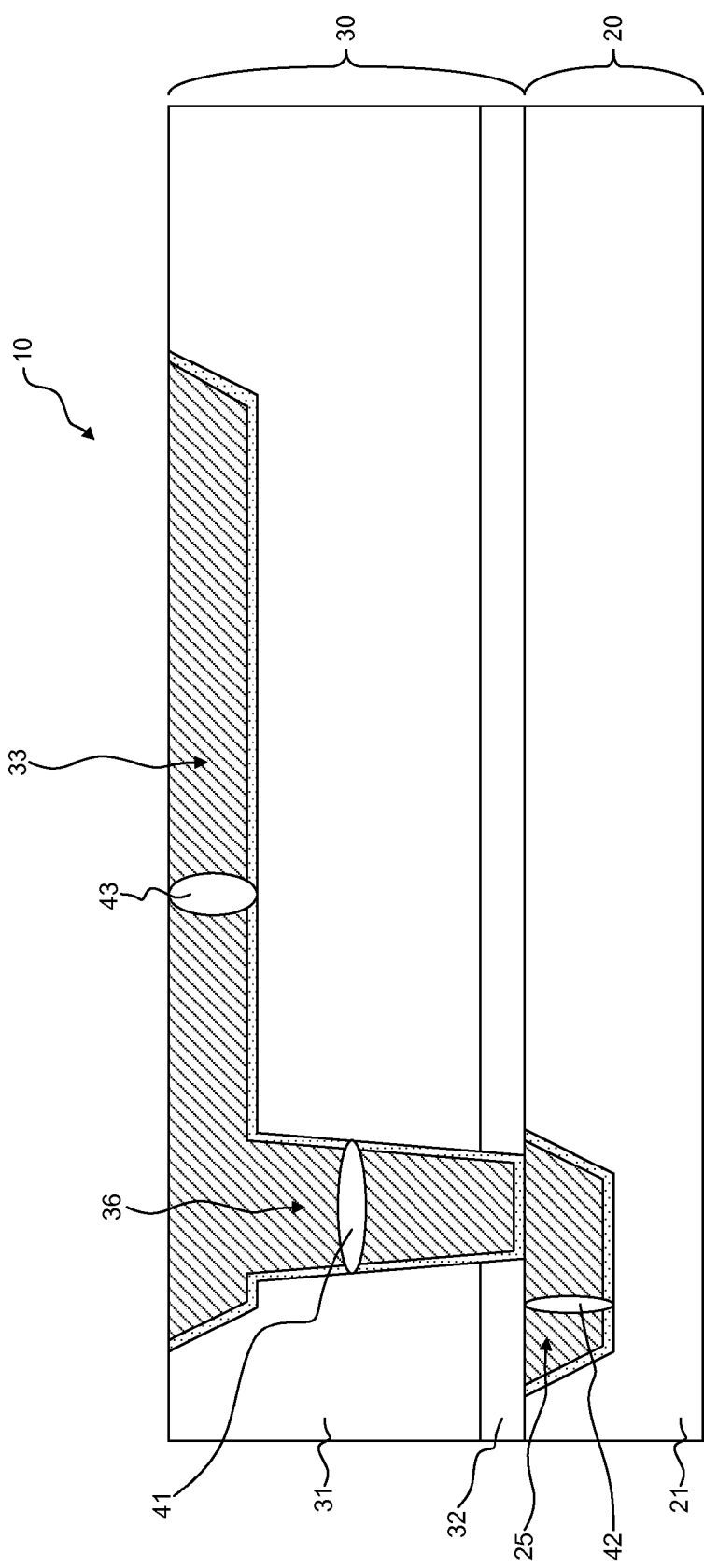
FIG. 1 depicts an example of a conventional e-fuse via after programming.
Figure 2:
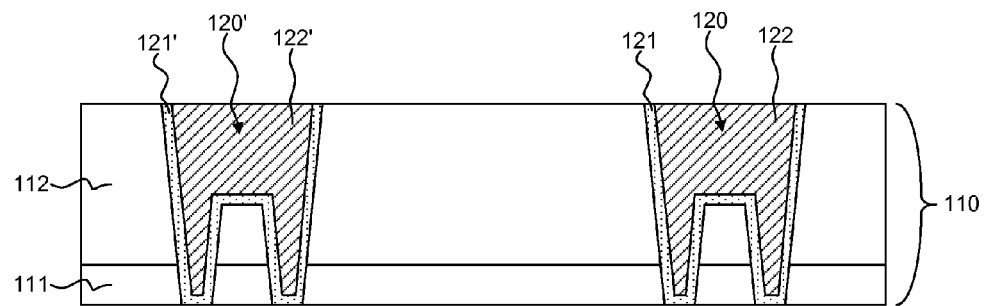
FIG. 2 depicts a first metallization level having a first metal structure and a second metal structure according to an exemplary embodiment.

Referring to FIG. 2, a first metallization level 110 is provided. First metallization level 110 may include a first metal structure 120 and a second metal structure 120' formed in a first insulator layer 112 and a capping layer 111. The first insulator layer 112 may be made of, for example, $SiO_2$, $Si_3N_4$, SiCOH, SiLK, or porous dielectrics. The first insulator layer 112 may further contain an adhesion layer (not shown) that may be made of, for example, silicon dioxide. In some embodiments, the first insulator layer 112 may have a dielectric constant of about 3 or less. The capping layer 111 may made of, for examples, $Si_3N_4$, SiC, SiCN, SiCH, or other known capping materials. The metal structures 120 and 120' may contain first liners 121 and 121', and first metal fills 122 and 122', respectively. The metal structures 120 and 120' may be formed by using, for example, a typical single or dual damascene technique in which trenches are formed in the insulator layer 112 and the capping layer 111 and then filled with the liners 121 and 121', and the metal fills 122 and 122'. The liners 121 and 121' may be made of, for example, tantalum or tantalum nitride, and may include one or more layers of liner material. The metal liners 121 and 121' may be formed from the same layer. The metal fills 122 and 122' may include, for example, copper, aluminum, or tungsten, and may be formed using a filing technique such as electroplating, electroless plating, chemical vapor deposition, physical vapor deposition or a combination of methods. The metal fills 122 and 122' may be formed from the same layer. As detailed in FIGS. 3-12, a second metallization level will be formed above the first metallization level 110, where the second metallization contains an e-fuse connected to the first metal structure 120 but not to the second metal structure 120'.

Figure 3:
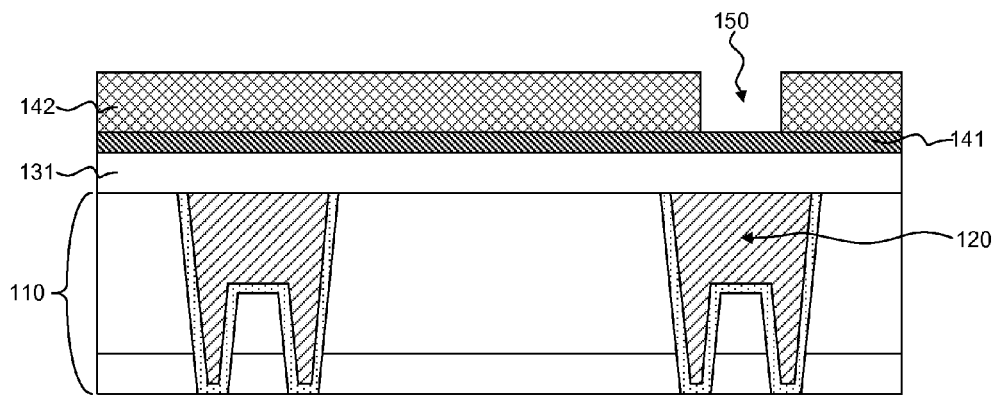
FIG. 3 depicts forming a capping layer and mask layers above the first metallization level, where the mask layer contains an opening above the first metal structure of the first metallization level, according to an exemplary embodiment.

Referring to FIG. 3, a capping layer 131 and photoresist layer 142 are formed on the top surface of the structure of FIG. 2 by any method known in the art. In some embodiments, an anti-reflective coating layer 141 may be formed between the capping layer 131 and the photoresist layer 142. The capping layer 131 may be made of, for examples, $Si_3N_4$, SiC, SiCN, SiCH, or other known capping materials. The anti-reflective coating layer 141 may be made of, for example, silicon-containing organics or titanium-containing organics. The photoresist layer 142 may contain the opening 150, the width of which will define the width of the e-fuse interface region formed in FIGS. 4-6. In one embodiment, the width of the opening 150 may range from about 5 nm to about 1000 nm.

Figure 4:
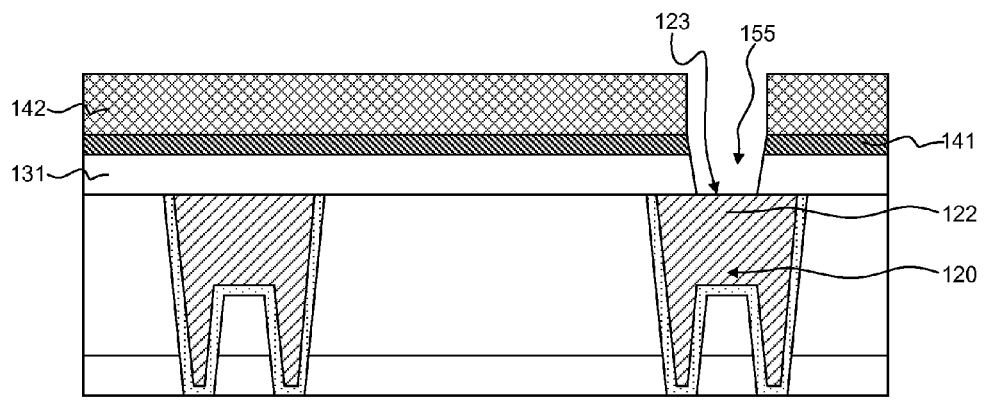
FIG. 4 depicts etching the capping layer of the second metallization level to expose a top surface of the first metal structure of the first metallization level, according to an exemplary embodiment.
Figure 5:
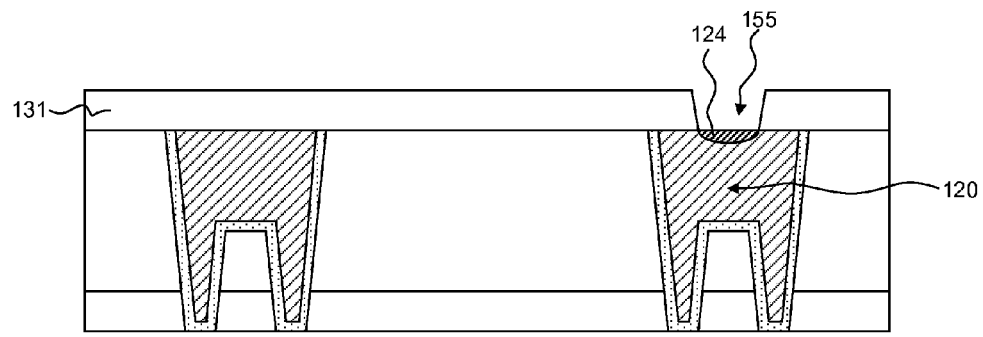
FIG. 5 depicts removing the mask layer from above the first metallization level, according to an exemplary embodiment.
Figure 6:
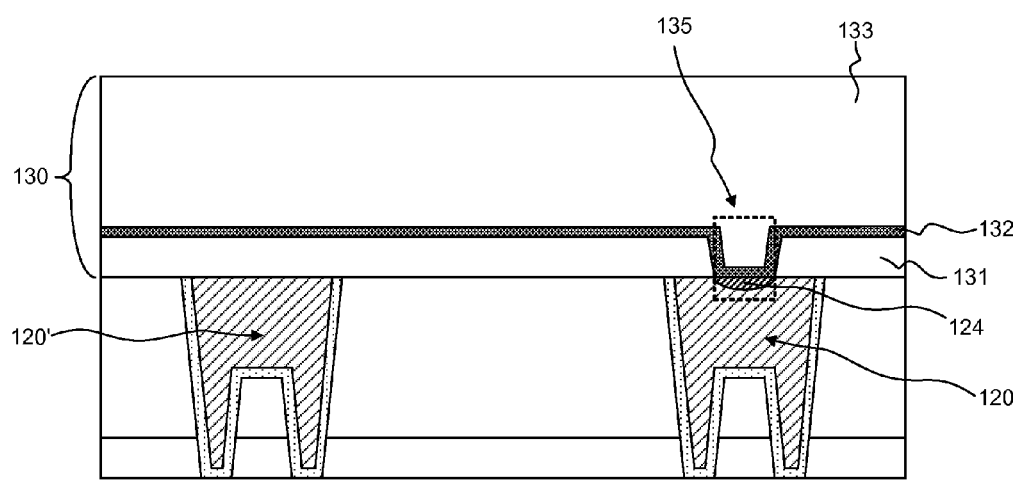
FIG. 6 depicts forming an adhesion layer and an insulator layer above the top surface of the first metallization level, according to an exemplary embodiment.

FIGS. 4-6 depict the formation of an e-fuse interface region 135 (FIG. 6) where a later-formed e-fuse via will meet the metal structure 120. Referring to FIG. 4, the anti-reflective coating layer 141 (if present) and the capping layer 131 may be etched, using the opening 150 of the photoresist layer 142 as a mask, to form opening 155 in capping layer 131 and expose a top surface 123 of the metal fill 122 of the metal structure 120. The anti-reflective coating layer 141 and the capping layer 131 may be etched using any known etching process including, for example, reactive ion etching (RIE).

Referring to FIG. 5, the anti-reflective coating layer 141 and the photoresist layer 142 may be removed using, for example, a $CO_2/CO/O_2/N_2/H_2$ plasma ash. While removing the anti-reflective coating layer 141 and the photoresist layer 142, the top surface 123 (FIG. 4) of the metal fill 121 may be contaminated, for example, by the plasma. Alternatively, any other known process that will remove the anti-reflective coating layer 141 and the photoresist layer 142 while also introducing contaminants into the metal fill 121 may be used. The plasma contamination may cause a region of the metal fill 121 to be weakened and more prone to failure. In FIG. 5, this region is labeled as the weakened region 124. In some embodiments, the ashing process may also remove some portion of the metal fill 121, further weakening the weakened region 124. When an e-fuse via is formed connecting to the weakened region 124 (as depicted in FIGS. 7-12), the via will be more likely to fail at the site of the connection and less likely to fail in the metal structures connected to the via.

Referring to FIG. 6, an adhesion layer 132 and a second insulator layer 133 may be deposited on the top surface of the structure of FIG. 5 to form a second metallization level 130 (also including the capping layer 131) above the first metallization level 110. The adhesion layer 132 may be made of, for example $SiO_2$ and be about 20-40 angstroms thick. Contact between the adhesion layer 132 and the weakened region 124 may further damage the weakened region 124 due to the introduction of material of the adhesion layer 132 into the weakened region 124. For example, where the adhesion layer 132 is made of $SiO_2$, oxygen from the adhesion layer 132 may migrate into the metal of the weakened region 124. The insulator layer 133 may be made of any of the same materials as the first insulator layer 112. The region including the weakened region 124, and the portions of the adhesion layer 132 and the insulator layer 133 that fill opening 155 are hereafter referred to as e-fuse interface region 135.

Figure 7:
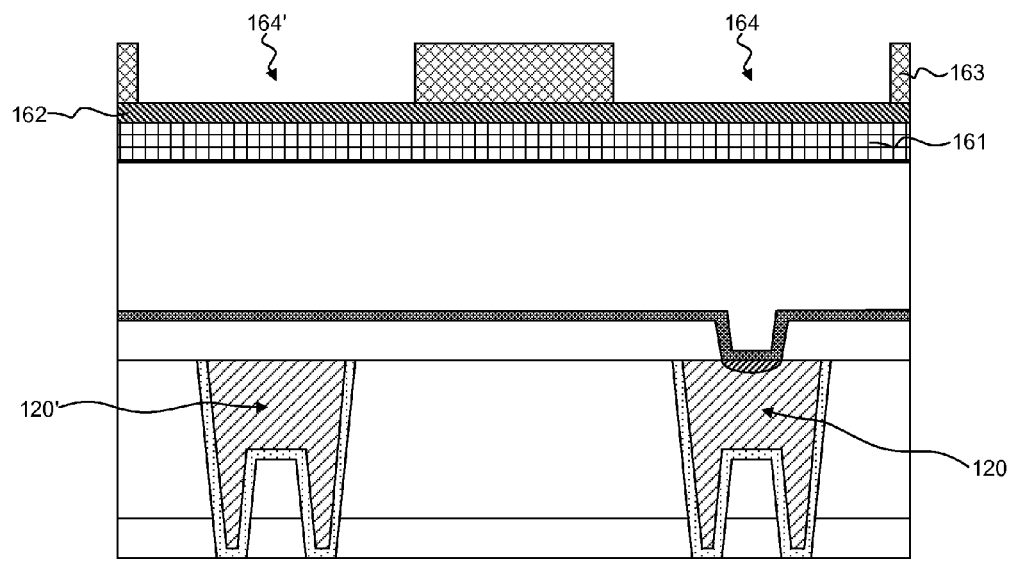
FIG. 7 depicts forming a metal mask layer and a second photoresist mask layer above the second metallization level, where the second photoresist mask layer contains openings that define the widths of the lines formed above the e-fuse via to the first metal structure and the non-fuse via to the second metal structure.

FIGS. 7-12A illustrate a process for forming metal structures in the second metallization level 130, including a fuse via to the metal structure 120, a non-fuse via to the metal structure 120', and metal lines above the fuse via and non-fuse via. Specifically, FIGS. 7-12A depict a trench-first metal hard mask process. However, the present invention will be understood to include embodiments where the metal structures of second metallization level are formed by other known back-end processes. Referring to FIG. 7, a metal hard mask layer 161 and a photoresist layer 163 may be deposited on the top surface of the structure of FIG. 6. In some embodiments, an anti-reflective coating layer 162 may be formed between the metal hard mask layer 161 and the photoresist layer 163. The metal hard mask layer 161 may be made of, for example, titanium nitride or tantalum. The anti-reflective coating layer 162 may be made of, for example silicon- or titanium-containing organics. The photoresist layer 163 may be made of any known photoresist material and includes openings 164 and 164' above metal structures 120 and 120'. The width of the openings 164 and 164' will define the width of the metal lines formed above the fuse via the non-fuse via, as further detailed in FIGS. 11-12A. In one embodiment, the width of the openings 164 and 164' may range from about 10 to about 1000 nm.

Figure 8:
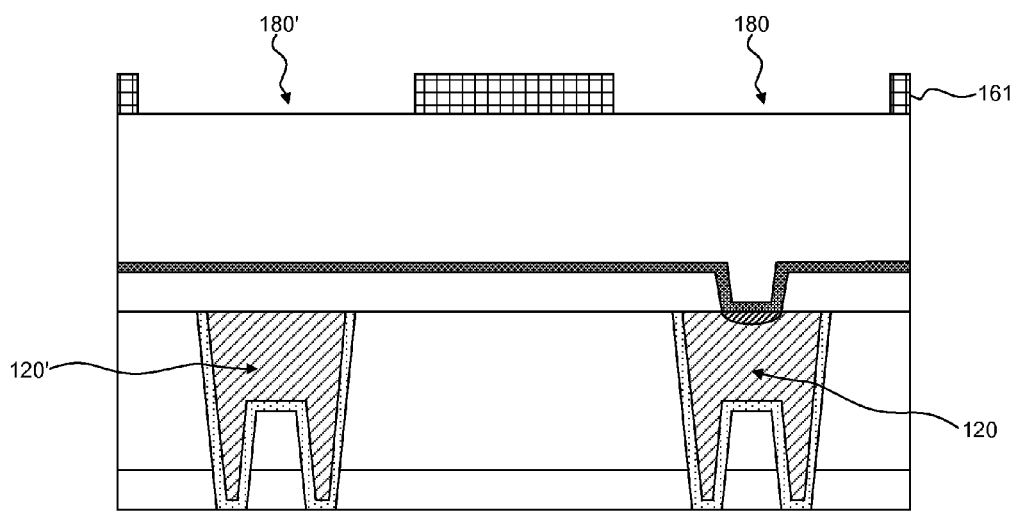
FIG. 8 depicts etching the metal mask layer using the second photoresist mask layer as a mask to transfer the pattern defined by the openings of the photoresist mask layer into the metal mask layer.

Referring to FIG. 8, the pattern defined by the openings 164 and 164' of the photoresist layer 163 may be transferred into the anti-reflective coating layer 162 and the metal hard mask layer 161 by, for example, an etching process such as RIE. Following etching the metal hard mask layer 161, the anti-reflective coating layer 162 and the photoresist layer 163 are removed by, for example, a plasma etching process such as the one used to remove the anti-reflective coating layer 141 and the photoresist layer 142 as depicted in FIG. 4.

Figure 9:
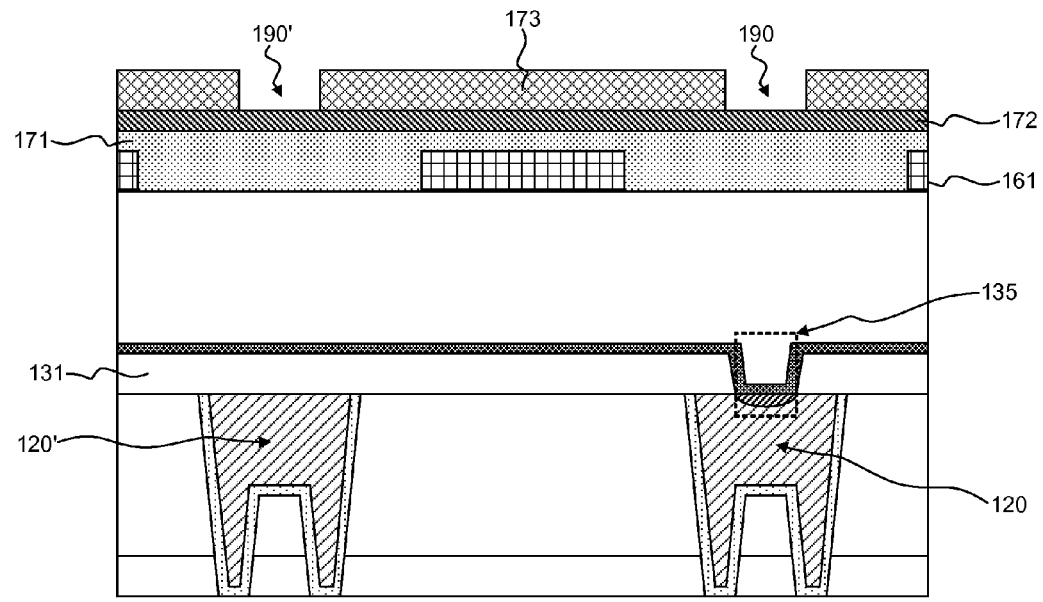
FIG. 9 depicts forming a planarization layer, and a third photoresist mask layer above the structure of FIG. 8, where the third photoresist mask layer contains openings the defines the widths of the e-fuse via to the first metal structure and the non-fuse via to the second metal structure.
Figures 13A, 13B:
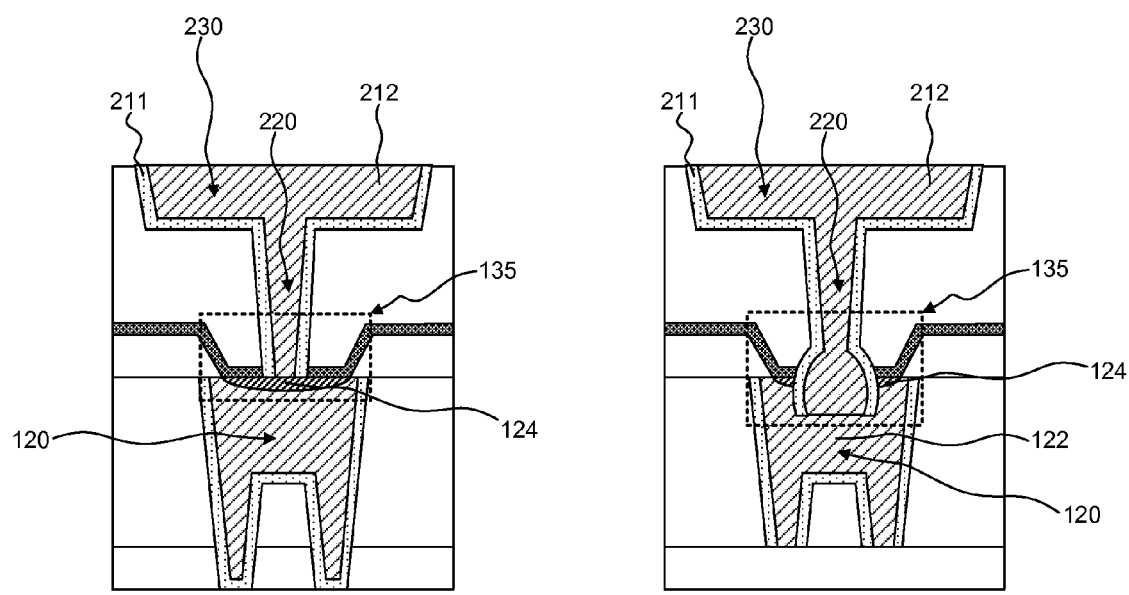
FIGS. 13A-13B depicts further embodiments of the invention where the e-fuse via interface region is wider than the e-fuse via.

Referring to FIG. 9, a planarization layer 171 and a third photoresist layer 173 may be deposited on the top surface of the structure of FIG. 8. In some embodiments, a third anti-reflective coating layer 172 may be formed between the planarization layer 171 and the third photoresist layer 173. The planarization layer 171 may be made of an organic planarization material and be thick enough to have a substantially flat top surface. The third anti-reflective coating layer 172 and the third photoresist layer 173 are then formed on a top surface of the planarization layer 171. The third anti-reflective coating layer 172 may be made of, for example, silicon- or titanium-containing organics. The third photoresist layer 173 may be made of any known photoresist material and contains openings 190 and 190' above the metal structures 120 and 120', respectively. The widths of the openings 190 and 190' define the widths of the e-fuse via formed to the metal structure 120 and the non-fuse via to metal structure 120', respectively. In some embodiments, the opening 190 has approximately the same width as the opening 190'. In one embodiment the width of the opening 190 is approximately the same as the opening 150 (FIG. 3), so that the e-fuse via formed to the metal structure 120 is approximately the same width as the e-fuse interface region 135. In other embodiments, the width of the opening 190 is smaller than the opening 150 so that the e-fuse interface region 135 may be wider than the width of the e-fuse via, as depicted in FIGS. 13A-13B. In one embodiment, the wide of the openings 190 and 190' may range from about 5 nm to about 1000 nm.

Figure 10:
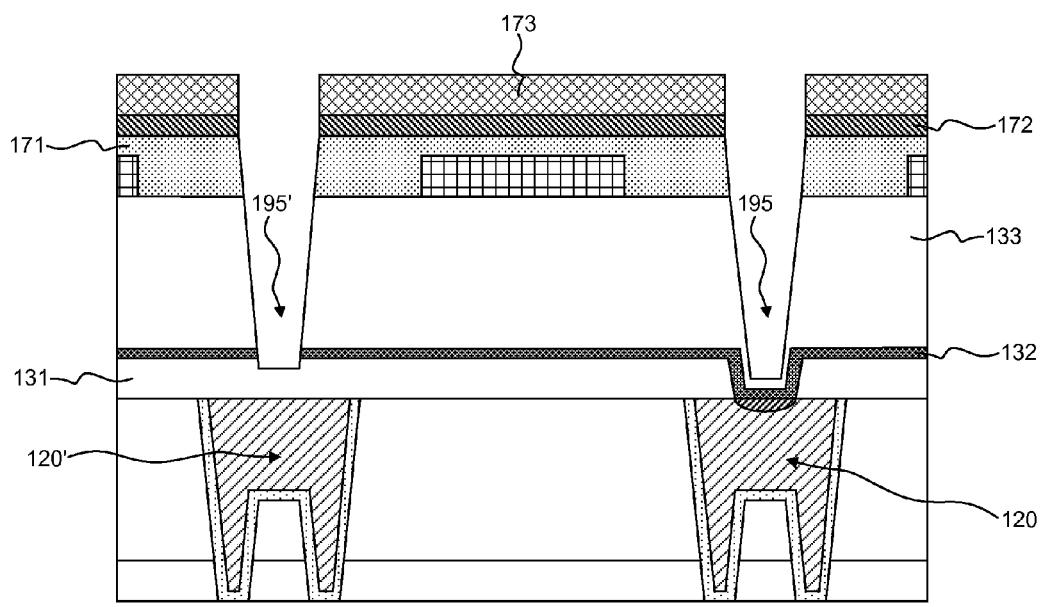
FIG. 10 depicts partially forming the e-fuse via recess and the non-fuse via recess by etching into the adhesion layer and the second insulator layer of the second metallization level.

Referring to FIG. 10, an e-fuse via recess 195 and a non-fuse via recess 195' are partially formed. With respect to the non-fuse via recess 195', the etch goes through the third anti-reflective coating layer 172, the planarization layer 171, the second insulator layer 133, the adhesion layer 132, and stops within the capping layer 131. With respect to the e-fuse via recess 195, the etch goes through the third anti-reflective coating layer 172, the planarization layer 171, and preferably stops within the second insulator layer 133, (or partially in the adhesion layer 132 if not perfectly aligned). Thus, after this etching step, the e-fuse via recess 195 may extend into the insulator layer 133, while the non-fuse via recess 195' may etch into the capping layer 131. Neither the e-fuse via recess 195 nor the non-fuse via recess 195' may extend fully to the metal structures 120 and 120'.

Figure 11:
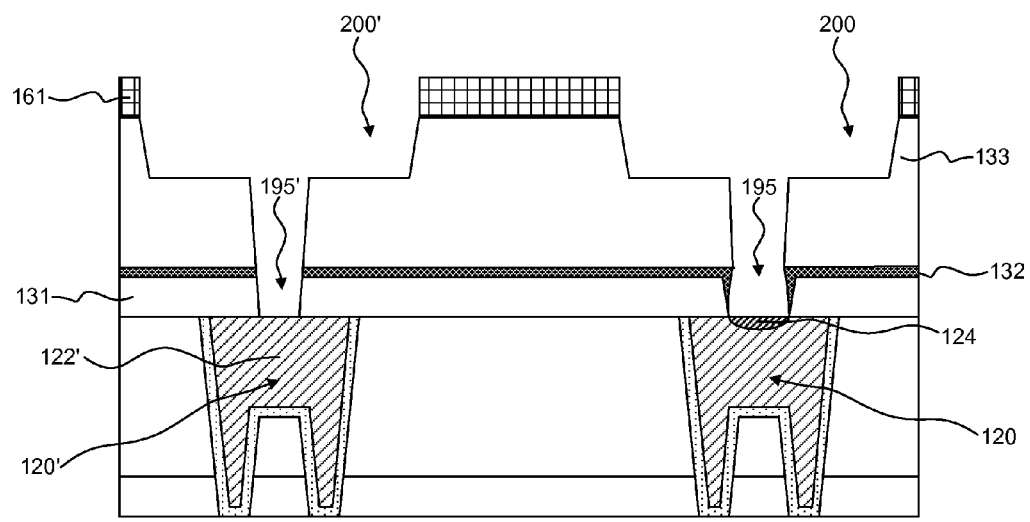
FIG. 11 depicts forming the line recesses above the e-fuse via recess and the non-fuse via recess and deepening the e-fuse via recess so that it exposes a top surface of the first metal structure and the non-fuse via recess so that it exposes a top surface of the second metal structure

Referring to FIG. 11, the planarization layer 171 (FIG. 10), the third anti-reflective coating layer 172 (FIG. 10), and the third photoresist layer 173 (FIG. 10) may be removed using, for example a plasma ashing process such as the process used to remove the anti-reflective coating layer 141 and the photoresist layer 142 as depicted in FIG. 4. The insulator layer 133, the adhesion layer 132, and the capping layer 131 may then be etched using the metal hard mask layer 161 as a mask by, for example, an etching process such as RIE. The etching process may form line recess 200 and line recess 200' while also deepening the e-fuse via recess 195 and the non-fuse via recess 195' so that e-fuse via recess 195 exposes a top surface of weakened region 124 and the non-fuse via recess 195' exposes a top surface of metal fill 122'. Following the etching process, line recess 200, line recess 200', e-fuse via recess 195, and non-fuse via recess 195' may be cleaned by a wet clean process, such as with dilute hydrofluoric acid. In some embodiments, the wet clean process may result in the e-fuse via recess 195 having a flared bottom where a portion of the sidewalls of the e-fuse via recess 195 are formed by the adhesion layer 132. This flaring may occur because the adhesion layer 132 may be formed of a material (e.g. silicon dioxide) that is more susceptible to the wet-clean process than capping layer 131 and insulator layer 133. Because non-fuse via recess 195' may not have substantial portions of its sidewalls formed by adhesion layer 132, it may not have the same substantially flared shape after the wet clean process. Therefore, in some embodiments the e-fuse via is deformed such that the bottom width of e-fuse via recess 195 may be greater than the bottom width of non-fuse via recess 195'. Or stated another way, in some embodiments the e-fuse via is deformed such that the bottom width of e-fuse via recess 195 may be greater than the width of the e-fuse via at the middle or top. Meanwhile, the via profile of the non-fuse via recess 195' is relatively uniform.

Figure 12A:
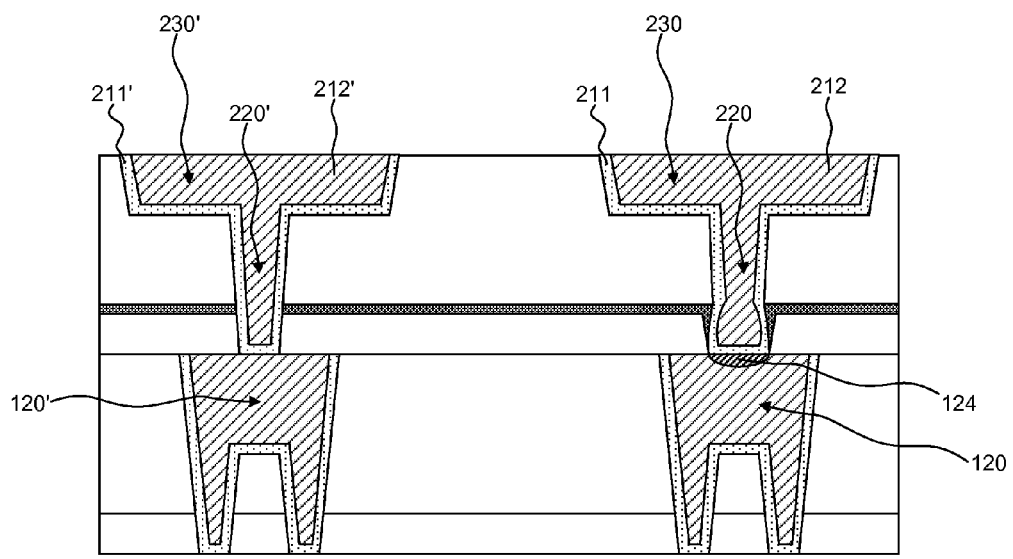
FIG. 12A depicts depositing liners and metal fills into the line recesses, the e-fuse via recess, and the non-fuse via recess to form an e-fuse via between the first metal structure and an above-formed line and a non-fuse via between the second metal structure and an above-formed line.
Figure 12B:
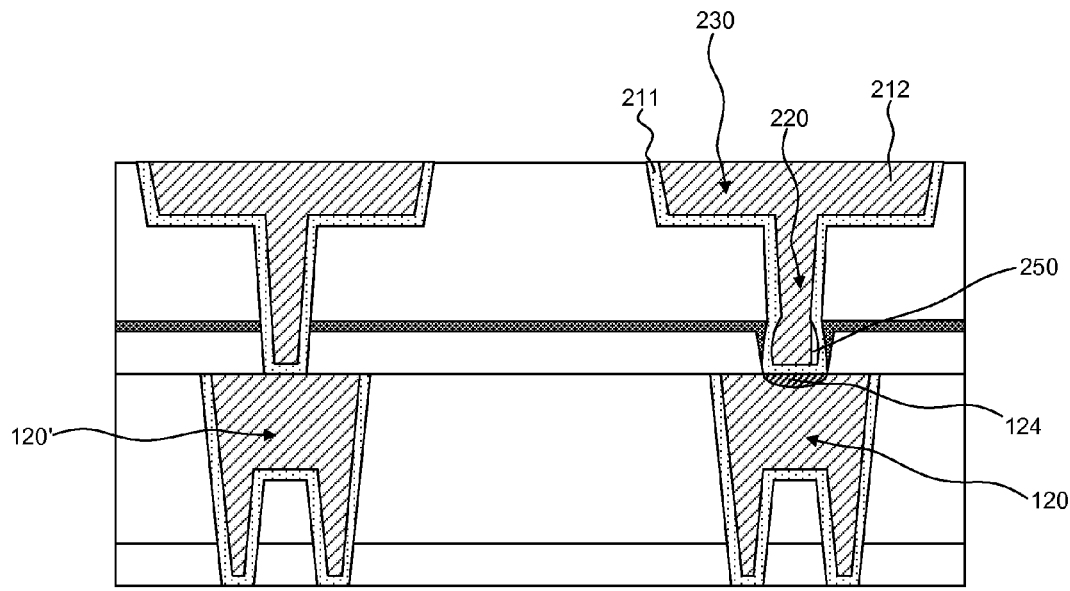
FIG. 12B depicts the formation of a void in the e-fuse via after depositing liners and metal fills into the line recesses, the e-fuse via recess, and the non-fuse via recess.

Referring to FIG. 12A, a liner 211 and a metal fill 212 may be deposited in line recess 200 and the e-fuse via recess 195 to form a metal line 230 and an e-fuse via 220, respectively. Similarly, a liner 211' and a metal fill 212' may be deposited in the line recess 200' and the non-fuse via recess to form the metal line 230' and the non-fuse via 220', respectively. Liners 211 and 211' may be formed from the same layer deposited simultaneously in the line recess 200, the e-fuse recess 195, the line recess 200' and the non-fuse via recess 195'. Further, metal fills 212 and 212' may be formed from the same layer deposited simultaneously in the line recess 200, the e-fuse recess 195, the line recess 200' and the non-fuse via recess 195' after the deposition of liners 211 and 211'. The liner 211 and the liner 211' may be made of, for example, tantalum or tantalum nitride, and may include one or more layers of liner material. Metal fills 212 and 212' may include, for example, copper, aluminum, or tungsten, and may be formed using a filing technique such as electroplating, electroless plating, chemical vapor deposition, physical vapor deposition or a combination of methods. In some cases, the process of forming the metal fill 212 may result in the formation of voids, such as a void 250 at the bottom of the e-fuse via recess 195 (FIG. 11), as depicted in FIG. 12B. The void 250 consists of a region of empty space formed due to the metal fill 212, and possibly the metal liner 211, not being able to fill the flared bottom of the e-fuse via recess 195. The void 250 introduces another point of weakness into the e-fuse via 220, further increasing the likelihood that the point of failure during programming will occur within the e-fuse via 220 and not within the metal structure 120 or the metal line 230. Therefore, the formation of the void 250 is desirable.

Continuing with FIGS. 12A and 12B, because the interface between e-fuse via 220 and metal structure 120 includes weakened region 124, failure is more likely to occur at the interface between e-fuse via 220 and weakened region 124, rather than in metal structure 120 or metal line 230. Further, because weakened region 124 is more susceptible to failure, it can be blown by relatively lower current. Because a relatively higher current can be avoided, damage is less likely to occur in nearby circuits that are not intended to be blown, such as those including metal structure 120, non-fuse via 220' and metal line 230'.

FIGS. 13A-13B depict other embodiments wherein the interface between the e-fuse via 220 and metal structure 120 differs from the interface depicted in FIGS. 12A-12B. As depicted in FIG. 13A, via interface region 135 is wider than e-fuse via 220. This has the advantage of allowing for greater tolerances while forming e-fuse via 220 because via 220 may be successfully formed anywhere in via interface region 135. Referring to FIG. 13B, another embodiment is depicted wherein via interface region 135 is wider than e-fuse via 220 and a gouge via process is use to form e-fuse via 220. In an exemplary gouge via process, argon sputtering in the metallization process gouges metal fill 122 and transfers the isotropic profile of via 220 into the copper as shown in FIG. 13B.

The result of the above described methods is that a vertical e-fuse structure can be simultaneously formed with a non-fuse structure by the addition of the cap layer opening step (FIG. 4). The vertical e-fuse formed by the above described methods includes a first metal (in a first metallization level), a e-fuse via and a metal line (in a second metallization level). There exists an e-fuse interface 135 where the e-fuse via meets the first metal. This e-fuse interface can be damaged. Damage may include a physical deformity such a flared bottom width of the e-fuse via, a void in the bottom of the e-fuse via, or an undercut of the capping, adhesion or insulators at the bottom of the e-fuse via. This physical damage makes the e-fuse structure more susceptible to fuse blow. Damage may also include chemical damage such as plasma damage to the top surface of the first metal, or oxygen incorporation at the top surface of the first metal. This chemical damage may occur, for example, by exposure to a plasma ash and/or oxide film. This chemical damage creates a weakened top surface of the first metal which is susceptible to fuse blow. Meanwhile, in the non-fuse structure, no opening in the capping layer was made, therefore, it will not experience the physical or chemical damage endured by the e-fuse via. (Compare structures in FIG. 12B).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a vertical electronic fuse structure, the method comprising:
   providing a first metallization level including a first metal structure having a top surface substantially flush with a top surface of the first metallization level;
   forming a capping layer on the top surface of the first metallization level;
   forming an opening in the capping layer that exposes a portion of the top surface of the first metal structure;
   forming an adhesion layer above the capping layer, wherein the adhesion layer lines the opening in the capping layer and contacts the first metal structure;
   forming an insulating layer above the adhesion layer;
   etching the insulating layer and the adhesion layer to form a fuse via recess, wherein the fuse via recess exposes the top surface of the first metal structure; and
   filling the fuse via recess to form a fuse via.

2. The method of claim 1, further comprising forming a weakened region at the top surface of the first metal structure.

3. The method of claim 2, wherein forming the weakened region comprises subjecting the exposed portion of the top surface of the first metal structure to a plasma ashing process.

4. The method of claim 1, wherein forming the adhesion layer comprises depositing a SiO2 layer on the capping layer and on the exposed portion of the top surface of the first metal structure, and wherein depositing the SiO2 layer causes oxygen from the SiO2 layer to migrate into the first metal structure to form a weakened region at the top surface of the first metal structure.

5. The method of claim 1, wherein etching the insulating and adhesion layers forms a damaged region at a bottom of the fuse via recess.

6. The method of claim 5, wherein the damaged region comprises a void.

7. The method of claim 6, wherein the damaged region comprises a flared bottom, and wherein the bottom of the fuse via recess is wider than a middle of the fuse via recess.

8. The method of claim 1, wherein etching the insulating and adhesion layers includes a dilute hydrofluoric acid wet clean.

9. The method of claim 1, further comprising:
- providing a second metal structure having a top surface substantially flush with the top surface of the first metallization level;
- etching the insulating layer, adhesion layer, and capping layer to form a non-fuse via recess, wherein the non-fuse via recess exposes the top surface of the second metal structure; and
- filling the non-fuse via recess to form a non-fuse via.

* * * * *